United States Patent
Lee et al.

(10) Patent No.: US 9,559,323 B2
(45) Date of Patent: Jan. 31, 2017

(54) ORGANIC LIGHT EMITTING DISPLAY DEVICE

(71) Applicant: LG DISPLAY CO., LTD., Seoul (KR)

(72) Inventors: Se-Hee Lee, Paju-si (KR); Kwan-Soo Kim, Paju-si (KR); Seok-Jong Lee, Goyang-si (KR); Jin-Ho Park, Paju-si (KR); Sun-Kap Kwon, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 163 days.

(21) Appl. No.: 14/109,084

(22) Filed: Dec. 17, 2013

(65) Prior Publication Data

US 2014/0167015 A1 Jun. 19, 2014

(30) Foreign Application Priority Data

Dec. 18, 2012 (KR) .......................... 10-2012-0148822

(51) Int. Cl.
*H01L 29/08* (2006.01)
*H01L 51/50* (2006.01)
(Continued)

(52) U.S. Cl.
CPC ......... *H01L 51/504* (2013.01); *H01L 51/5012* (2013.01); *H01L 51/5265* (2013.01);
(Continued)

(58) Field of Classification Search
CPC ................... H01L 2251/5384; H01L 27/3211; H01L 51/0058; H01L 51/0072; H01L 51/0077; H01L 51/0081; H01L 51/5012; H01L 51/504; H01L 51/5064; H01L 51/5218; H01L 51/5234; H01L 51/5265

See application file for complete search history.

(56) References Cited

U.S. PATENT DOCUMENTS

2002/0098379 A1* 7/2002 Arakane ............... C09K 11/06
428/690
2003/0042848 A1* 3/2003 Park et al. .................... 313/503
(Continued)

FOREIGN PATENT DOCUMENTS

| CN | 1407837 A | 4/2003 |
| CN | 1933173 A | 3/2007 |
| CN | 101521263 A | 9/2009 |

OTHER PUBLICATIONS

Chinese Office Action issue in Chinese Patent Application No. 201310688309 on Feb. 3, 2016.

*Primary Examiner* — John C Ingham
*Assistant Examiner* — Frederick B Hargrove
(74) *Attorney, Agent, or Firm* — Birch, Stewart, Kolasch & Birch, LLP

(57) ABSTRACT

An organic light emitting display device includes a first electrode formed on a substrate and being a reflective electrode, a second electrode facing the first electrode and being a semi-transparent electrode, and red, green and blue emission layers formed between the first and second electrodes, wherein a maximum electroluminescent peak of the redemission layer and a maximum photoluminescence peak of a host included in the red emission layer satisfy Equation 1 below:

$$RED_{EL\lambda max} - RH_{PL\lambda max} \geq 120 \text{ nm} \qquad <\text{Equation 1>}$$

wherein $RED_{EL\lambda max}$ is a maximum electroluminescent peak of the red emission layer, and $RH_{PL\lambda max}$ is a maximum photoluminescence peak of a red host included in the red emission layer.

6 Claims, 10 Drawing Sheets

(51) Int. Cl.
    H01L 51/52    (2006.01)
    H01L 27/32    (2006.01)
    H01L 51/00    (2006.01)

(52) U.S. Cl.
    CPC ....... H01L 27/3211 (2013.01); H01L 51/0058
        (2013.01); H01L 51/0072 (2013.01); H01L
        51/0077 (2013.01); H01L 51/0081 (2013.01);
        H01L 51/5064 (2013.01); H01L 51/5218
        (2013.01); H01L 51/5234 (2013.01); H01L
                                  2251/5384 (2013.01)

(56) References Cited

U.S. PATENT DOCUMENTS

| | | | |
|---|---|---|---|
| 2006/0170339 A1* | 8/2006 | Kanno | H01L 27/3211 313/506 |
| 2007/0057264 A1 | 3/2007 | Matsuda | |
| 2007/0069996 A1 | 3/2007 | Kuba et al. | |
| 2007/0286944 A1* | 12/2007 | Yokoyama et al. | 427/66 |
| 2008/0203908 A1* | 8/2008 | Hasegawa et al. | 313/504 |
| 2009/0212696 A1* | 8/2009 | Terao | 313/506 |
| 2010/0289014 A1* | 11/2010 | Ito | C08G 61/12 257/40 |
| 2012/0248424 A1* | 10/2012 | Sasaki | H01L 51/504 257/40 |
| 2013/0038640 A1* | 2/2013 | Kajimoto | 345/690 |
| 2013/0175508 A1* | 7/2013 | Kwon | H01L 27/3211 257/40 |

* cited by examiner

ORGANIC LIGHT EMITTING DISPLAY DEVICE

This application claims the benefit of Korean Patent Application No. 10-2012-0148822, filed on Dec. 18, 2012, which is hereby incorporated by reference as if fully set forth herein.

BACKGROUND OF THE INVENTION

Field of the Invention

The present invention relates to an organic light emitting display device with enhanced color purity according to viewing angle.

Discussion of the Related Art

Organic light emitting display devices, which one form of flat panel display device, are self-emissive devices and have faster response speed, higher luminous efficacy, higher luminance, and wider viewing angle than other flat panel display devices. An organic light emitting display device includes an anode, a cathode facing the anode, and an organic emission layer (EML) disposed therebetween. Holes injected from the anode and electrons injected from the cathode are recombined in the organic EML, forming excitons, which are electron-hole pairs and the excitons return to the ground state, thus releasing energy, whereby light is emitted.

As a method of enhancing optical efficiency by effectively extracting light emitted from an organic EML, microcavity is used. In a top emission structure, microcavity is based on a principle in which light is repeatedly reflected by a reflective electrode (e.g., an anode) and a semi-transparent electrode (e.g., a cathode) spaced a set distance apart (i.e., an optical path length), and strong interference effects between these light beams occurs and thus light having a particular wavelength is amplified and light having other wavelengths excluding the particular wavelength is eliminated.

In a microcavity structure, however, an optical path at the front and an optical path at the side differ and thus a wavelength of light that causes resonance is changed. Accordingly, the optical path at the side with a greater viewing angle than that of the front is relatively long and resonance light emitted is shifted towards short wavelengths. That is, as illustrated in FIG. 1A, a maximum electroluminescent peak of a red light emitting cell is shifted towards short wavelengths by about 75 to 85 nm at a viewing angle of 60° as compared to a viewing angle of 0°, as illustrated in FIG. 1B, a maximum electroluminescent peak of a green light emitting cell is shifted towards short wavelengths by about 36 to 50 nm at a viewing angle of 60° as compared to a viewing angle of 0°, and as illustrated in FIG. 1C, a maximum electroluminescent peak of a blue light emitting cell is shifted towards short wavelengths by about 10 to 14 nm at a viewing angle of 60° as compared to a viewing angle of 0°. This is because, when a non-uniform doping region is formed in an EML, light is emitted by an undoped host. Accordingly, a color shift phenomenon according to viewing angle occurs and thus a conventional organic light emitting display device has reduced reliability in color purity.

SUMMARY OF THE INVENTION

Accordingly, the present invention is directed to an organic light emitting display device that substantially obviates one or more problems due to limitations and disadvantages of the related art.

An object of the present invention is to provide an organic light emitting display device with enhanced color purity according to viewing angle.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes a first electrode formed on a substrate and being a reflective electrode, a second electrode facing the first electrode and being a semi-transparent electrode, and red, green and blue emission layers formed between the first and second electrodes, wherein a maximum electroluminescent peak of each of the red, green and blue emission layers and a maximum photoluminescence peak of a host included in each emission layer satisfy Equations 1 to 3 below.

$$RED_{EL\lambda max} - RH_{PL\lambda max} \geq 120 \text{ nm}, \quad \text{<Equation 1>}$$

wherein $RED_{EL\lambda max}$ is a maximum electroluminescent peak of the red emission layer, and $RH_{PL\lambda max}$ is a maximum photoluminescence peak of a red host included in the red emission layer.

$$Green_{EL\lambda max} - GH_{PL\lambda max} \geq 20 \text{ nm} \quad \text{<Equation 2>}$$

wherein $GREEN_{EL\lambda max}$ is a maximum electroluminescent peak of the green emission layer, and $GH_{PL\lambda max}$ is a maximum photoluminescence peak of a green host included in the green emission layer.

$$BLUE_{EL\lambda max} - BH_{PL\lambda max} \geq 20 \text{ nm}, \quad \text{<Equation 3>}$$

wherein $BLUE_{EL\lambda max}$ is a maximum electroluminescent peak of the blue emission layer, and $BH_{PL\lambda max}$ is a maximum photoluminescence peak of a blue host included in the blue emission layer.

The second electrode may have a transmittance of 30 to 60% at a wavelength of 430 nm, a transmittance of 20 to 50% at a wavelength of 550 nm, and a transmittance of 15 to 40% at a wavelength of 650 nm, and the second electrode may have a sheet resistance of 1Ω/□ to 15Ω/□ and a work function of 3.7 to 4.7 eV.

The maximum photoluminescence peak of a red host may be between 450 and 485 nm, the maximum photoluminescence peak of a green host may be between 450 and 530 nm, and the maximum photoluminescence peak of a blue host may be between 400 and 435 nm.

The red host may be formed of BAlq$_3$ series such as a compound represented by Formula 1 below, a material represented by Formula 2 below, or Be complexes such as BeBq$_2$ represented by Formula 3 below.

<Formula 1>

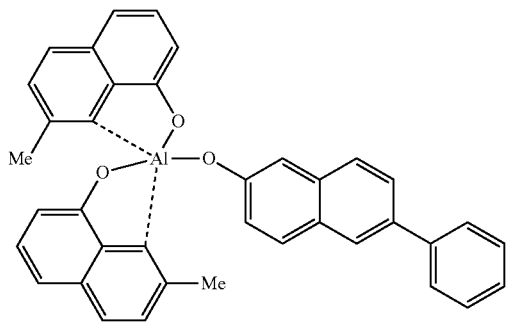

<Formula 2>

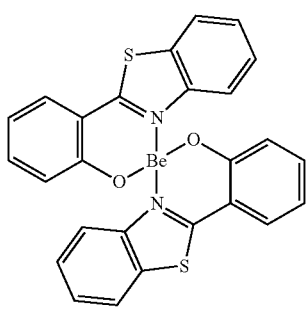

<Formula 3>

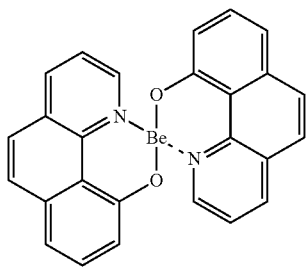

The green host may be formed of a material represented by Formula 4 below, BCP series such as a compound represented by Formula 5 below, CBP series such as a compound represented by Formula 6 below, CDBP series, or a material represented by Formula 7 below.

<Formula 4>

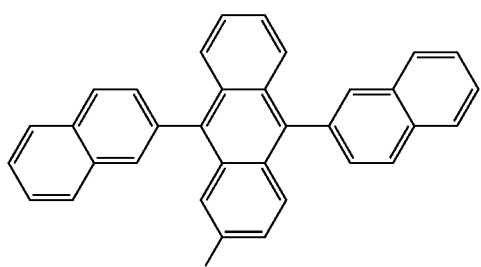

DNA/MADN/TBADN

<Formula 5>

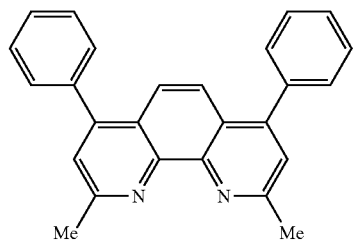

<Formula 6>

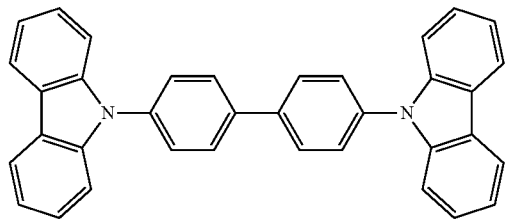

<Formula 7>

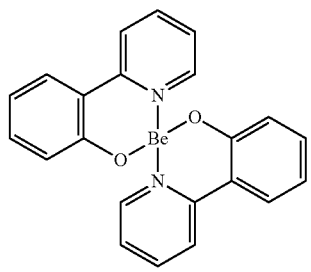

The blue host may be formed of a material represented by Formula 8 below or an anthracene derivative.

<Formula 8>

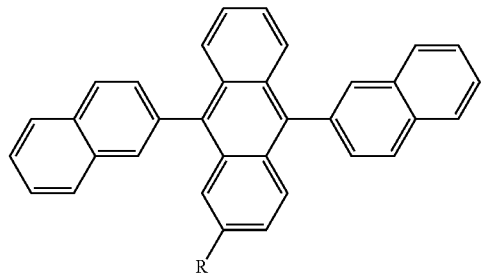

DNA/MADN/TBADN

The organic light emitting display device may further include a front sealing layer formed on the second electrode, the front sealing layer including organic layers and inorganic layers alternately formed several times.

The second electrode may have a single layer structure or a multilayer structure and has a total thickness of 100 to 400 Å, and each of the layers of the second electrode may be formed of a metal, an inorganic material, a mixture of metals, a mixture of a metal and an inorganic material, or a mixture thereof. When each layer is formed of the mixture of a metal and an inorganic material, a mix ratio of the metal to the inorganic material may be between 10:1 and 1:10. When each layer is formed of the mixture of metals, a mix ratio of the metals may be between 10:1 and 1:10.

The metal may be Ag, Mg, Yb, Li, or Ca, and the inorganic material may be $LiO_2$, CaO, LiF, or $MgF_2$.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings and the following examples.

Figure 1A:
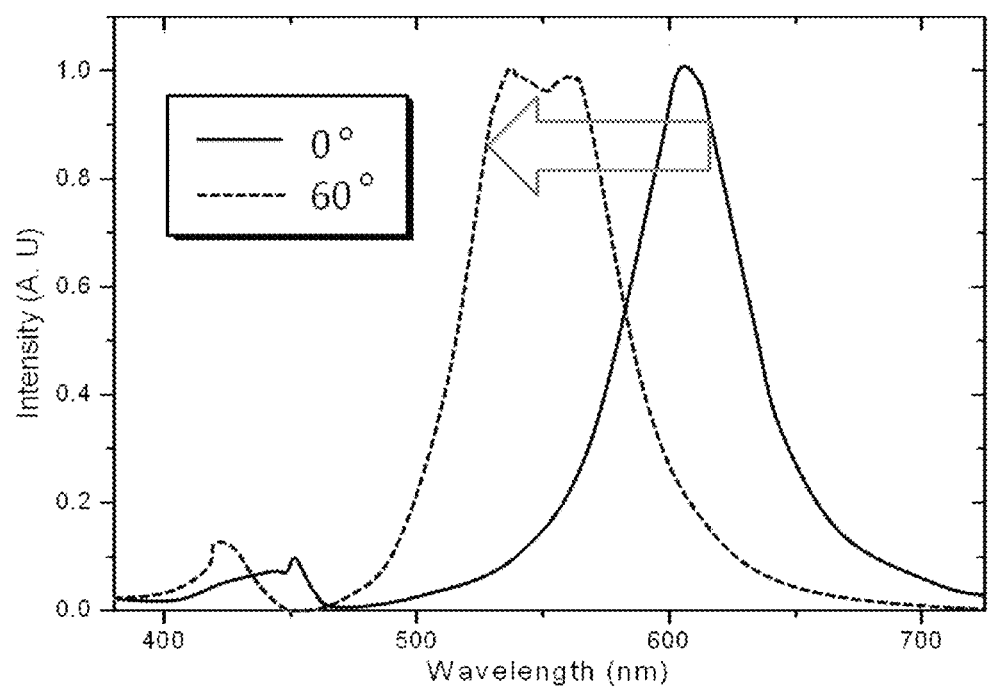
FIG. 1A is a graph showing luminescence spectrums according to viewing angle of a red light emitting cell of a conventional organic light emitting display device.
Figure 1B:
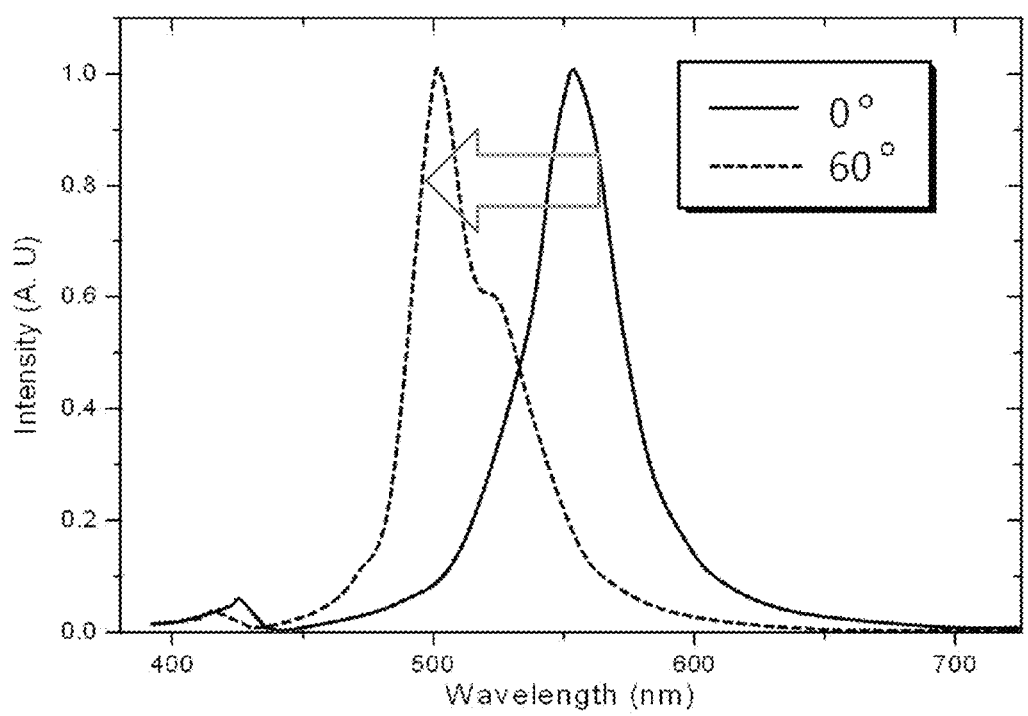
FIG. 1B is a graph showing luminescence spectrums according to viewing angle of a green light emitting cell of a conventional organic light emitting display device.
Figure 1C:
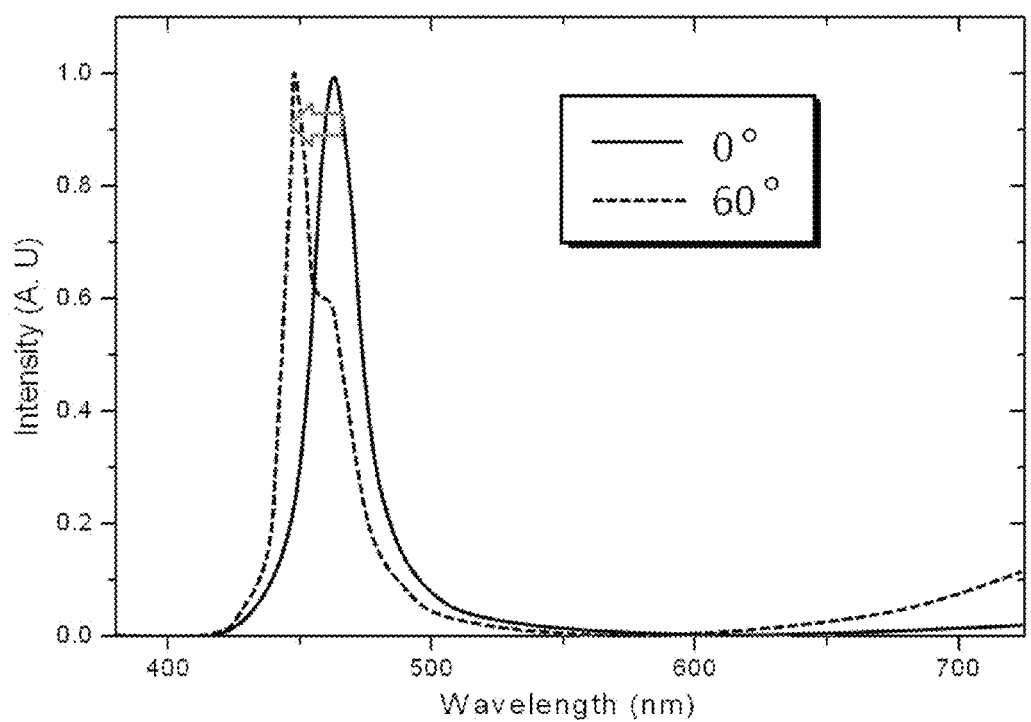
FIG. 1C is a graph showing luminescence spectrums according to viewing angle of a blue light emitting cell of a conventional organic light emitting display device.
Figure 2:
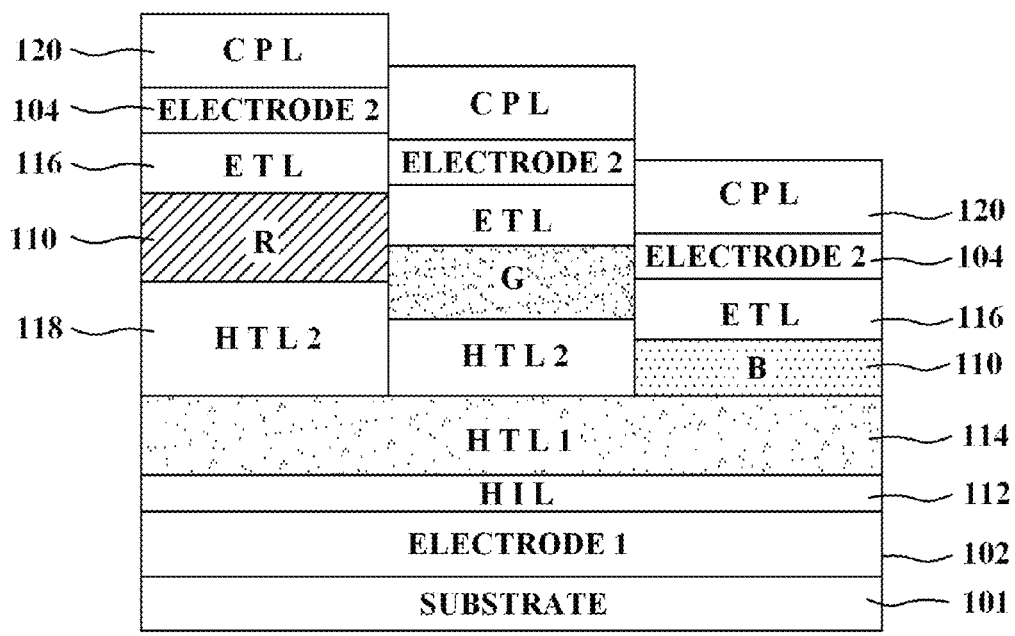
FIG. 2 is a sectional view of an organic light emitting display device according to the present invention.

FIG. 2 is a sectional view of an organic light emitting display device according to the present invention.

As illustrated in FIG. 2, the organic light emitting display device includes red, green and blue light emitting cells formed on a substrate 101.

Each of the red, green and blue light emitting cells includes a first electrode 102, a hole injection layer (HIL) 112, a first hole transport layer (HTL) 114, an emission layer (EML) 110, an electron transport layer (ETL) 116, a second electrode 104, and a front sealing layer 120 that are sequentially formed on the substrate 101. In addition, each of the red and green light emitting cells further includes a second HTL 118 formed between the first HTL 114 and the EML 110.

Any one of the first and second electrodes 102 and 104 is formed as a semi-transparent electrode and the other thereof is formed as a reflective electrode. When the first electrode 102 is a semi-transparent electrode and the second electrode 104 is a reflective electrode, the organic light emitting display device is of a bottom emission type emitting light downward. When the second electrode 104 is a semi-transparent electrode and the first electrode 102 is a reflective electrode, the organic light emitting display device is of a top emission type emitting light upward. In the present invention, a case in which the first electrode 102 as an anode is formed as a reflective electrode and the second electrode 104 as a cathode is a semi-transparent electrode will be described by way of example.

The first electrode 102 has a multilayer structure including a metal layer formed of aluminum (Al) or an Al alloy (e.g., AlNd) and a transparent layer formed of indium tin oxide (ITO), indium zinc oxide (IZO), or the like and serves as a reflective electrode.

The second electrode 104 is formed of a single layer or multiple layers, and each layer constituting the second electrode 104 is formed of a metal, an inorganic material, a mixture of metals, a mixture of a metal and an inorganic material, or a mixture thereof. In this regard, when each layer is formed of a metal and an inorganic material, a mix ratio of metal to inorganic material is between 10:1 and 1:10. When each layer is formed of a mixture of metals, a mix ratio of the metals is between 10:1 and 1:10. The metal constituting the second electrode 104 may be Ag, Mg, Yb, Li, or Ca and the inorganic material thereof may be $Li_2O$, CaO, LiF, or $MgF_2$, which assist movement of electrons and thus enable many electrons to be supplied to the EML 110.

The second electrode 104 has a thickness of 100 to 400 Å and a sheet resistance of 15Ω or less, and the second electrode 104 has a work function of 3.7 to 4.7 eV that is lower than that of the first electrode 102.

In addition, the second electrode 104 has a light transmittance of 30 to 60% at a wavelength of 430 nm, 20 to 50% at a wavelength of 550 nm, and 15 to 40% at a wavelength of 650 nm and thus serves as a semi-transparent electrode.

The HIL 112 supplies holes from the first electrode 102 to the first and second HTLs 114 and 118. The first and second HTLs 114 and 118 supply holes from the HIL 112 to the EML 110 of each light emitting cell. The second HTL 118 is not formed in the blue light emitting cell, and the thickness of the second HTL 118 is greater in the red light emitting cell than in the green light emitting cell. An efficiency of each light emitting cell in a vertical direction may be optimized through constructive interference of light emitted by adjusting the thickness of the second HTL 118 of each light emitting cell. The ETL 116 supplies electrons from the second electrode 104 to the EML 110 of each light emitting cell.

In each of the red (R), green (G) and blue (B) EMLs 110, the holes supplied via the first and second HTLs 114 and 118 and the electrons supplied via the ETL 116 are recombined, thereby generating light. In this regard, the R EML 110 has the greatest thickness, the B EML 110 has the smallest thickness, and the G EML 110 has a thickness within the range of the thicknesses of the R and B EMLs 110. The efficiency of each light emitting cell in a vertical direction may be optimized through constructive interference of light emitted by adjusting the thickness of the EML 110 of each light emitting cell.

The front sealing layer 120 prevents permeation of external moisture or oxygen and thus enhances reliability. For this operation, the front sealing layer 120 has a structure in which organic layers and inorganic layers are alternately formed several times. The inorganic layers are formed of at least one of aluminum oxide ($Al_xO_x$), silicon oxide ($SiO_x$), $SiN_x$, SiON, and LiF so as to primarily prevent permeation of external moisture or oxygen. The organic layers secondarily prevent permeation of external moisture or oxygen. In addition, the organic layers alleviate stress between the layers according to bending of the organic light emitting display device and enhance planarization performance. The organic layers are formed of an acryl-based resin, an epoxy-based resion, or a polymer material such as polyimide or polyethylene.

In the present invention, the R, G and B EMLs 110 are formed so as to satisfy conditions as shown in Equations 1 to 3 below.

$$RED_{EL\lambda max} - RH_{PL\lambda max} \geq 120 \text{ nm} \quad \text{[Equation 1]}$$

$$Green_{EL\lambda max} - GH_{PL\lambda max} \geq 20 \text{ nm} \quad \text{[Equation 2]}$$

$$BLUE_{EL\lambda max} - BH_{PL\lambda max} \geq 20 \text{ nm} \quad \text{[Equation 3]}$$

As shown in Equation 1, a difference between a maximum electroluminescent peak (RED$EL\lambda$max) of the R EML 110 and a maximum photoluminescence peak (RHPL$\lambda$max) of a red host included in the R EML 110 is 120 nm or greater. As shown in Equation 2, a difference between a maximum electroluminescent peak (GREEN$EL\lambda$max) of the G EML 110 and a maximum photoluminescence peak (GHPL$\lambda$max) of a green host included in the G EML 110 is 20 nm or greater. As shown in Equation 3, a difference between a maximum electroluminescent peak (BLUE$EL\lambda$max) of the B EML 110 and a maximum photoluminescence peak (BHPL$\lambda$max) of a blue host included in the B EML 110 is 20 nm or greater. A case in which each of the R, G and B EMLs 110 includes a single host has been described by way of example using Equations 1 to 3. In another embodiment, each of the R, G and B EMLs 110 includes at least two hosts and, in this case, one of the at least two hosts is formed so as to satisfy the conditions of Equations 1 to 3. In addition, in Equations 1 to 3, the electroluminescent peaks refer to maximum values of light emitted when a voltage is applied to the manufactured organic electroluminescent device, and the photoluminescence peaks refer to maximum values of light that represent a characteristic color of each EML.

In Equation 1, the red host has a maximum photoluminescence peak (RHPL$\lambda$max) of 450 to 485 nm and is formed of BAlq$_3$ series such as a compound represented by Formula 1 below, a material represented by Formula 2 below, or Be complexes such as BeBq$_2$ represented by Formula 3 below.

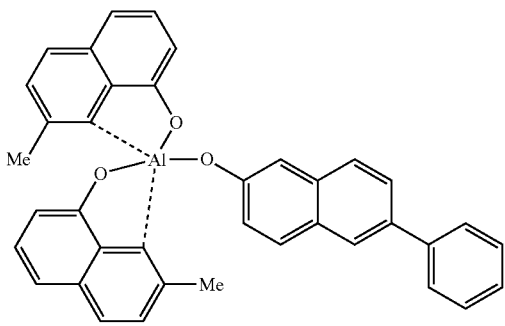

<Formula 1>

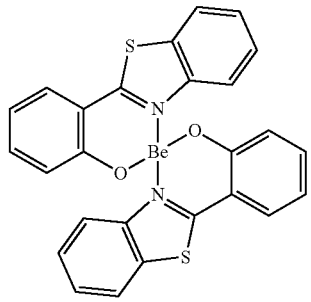

<Formula 2>

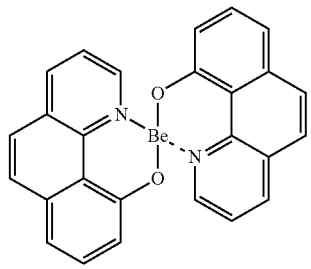

<Formula 3>

In Equation 2, the green host of the G EML 110 has a maximum photoluminescence peak (RHPL$\lambda$max) of 450 to 530 nm and is formed of a material represented by Formula 4 below, BCP series such as a compound represented by Formula 5 below, CBP series such as a compound represented by Formula 6 below, CDBP series, or a material represented by Formula 7 below.

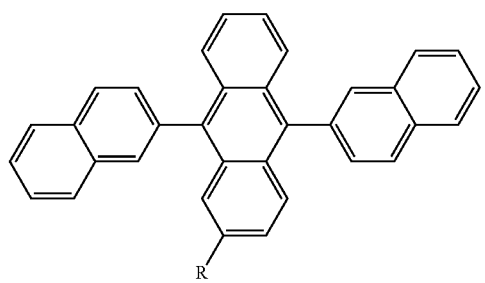

[Formula 4]

DNA/MADN/TBADN

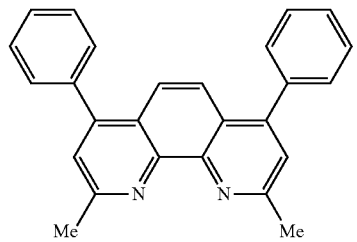

[Formula 5]

-continued

[Formula 6]

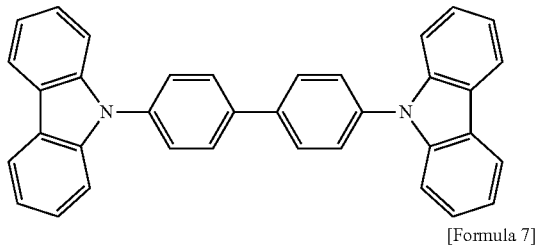

[Formula 7]

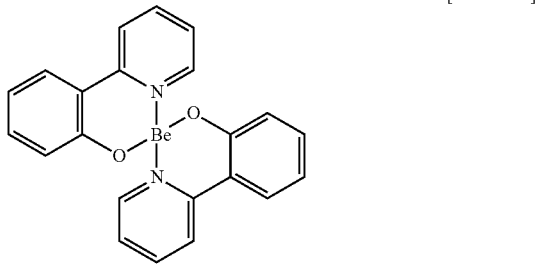

In Equation 3, the blue host of the B EML 110 has a maximum photoluminescence peak (RHPLλmax) of about 400 to 435 nm and is formed of a material represented by Formula 8 below or an anthracene derivative.

[Formula 8]

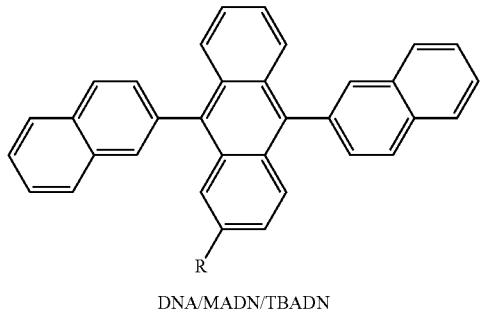

DNA/MADN/TBADN

Figure 3A:
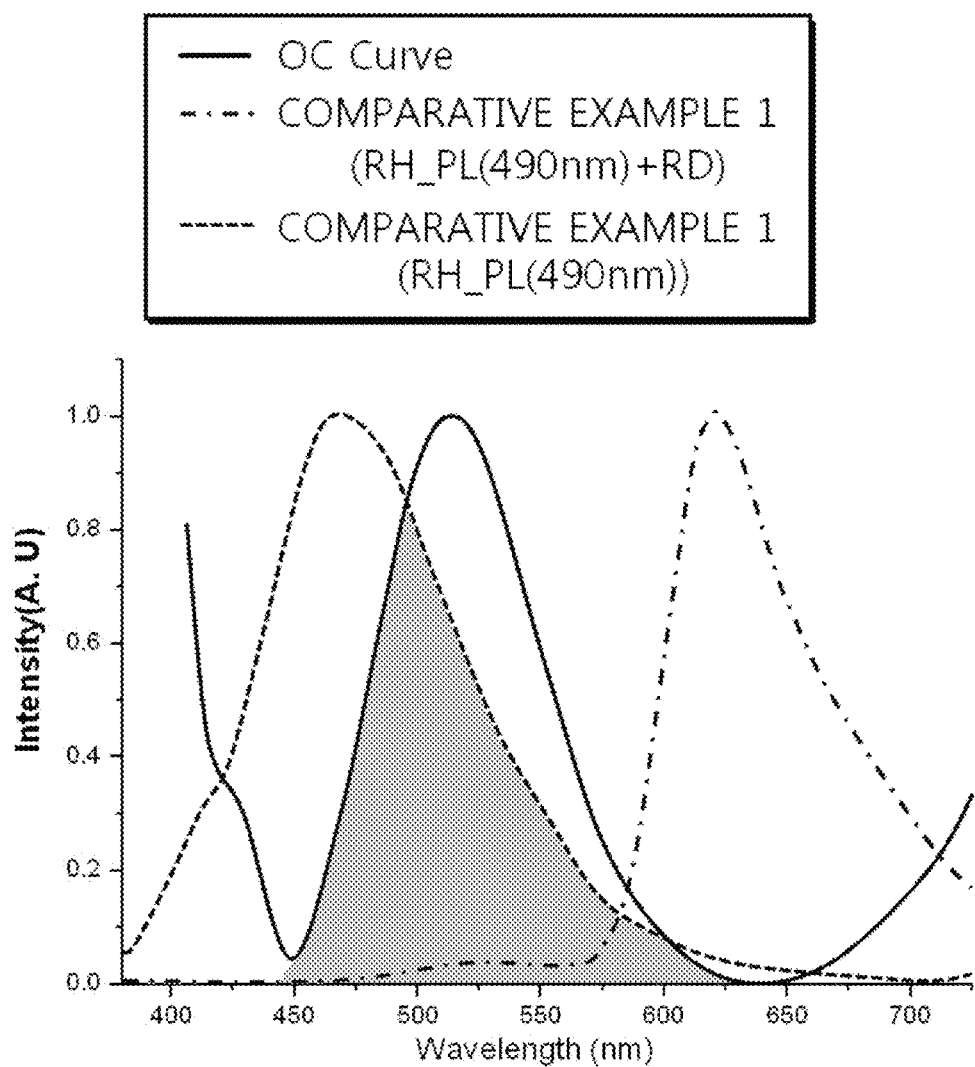
FIGS. 3A to 3C are graphs showing luminescence spectrums according to a maximum photoluminescence peak of a red host of a red emission layer of each of the organic light emitting display devices according to comparative examples and example when a second electrode of each thereof is formed as a transparent electrode and has a thickness of 500 Å.
Figure 3B:
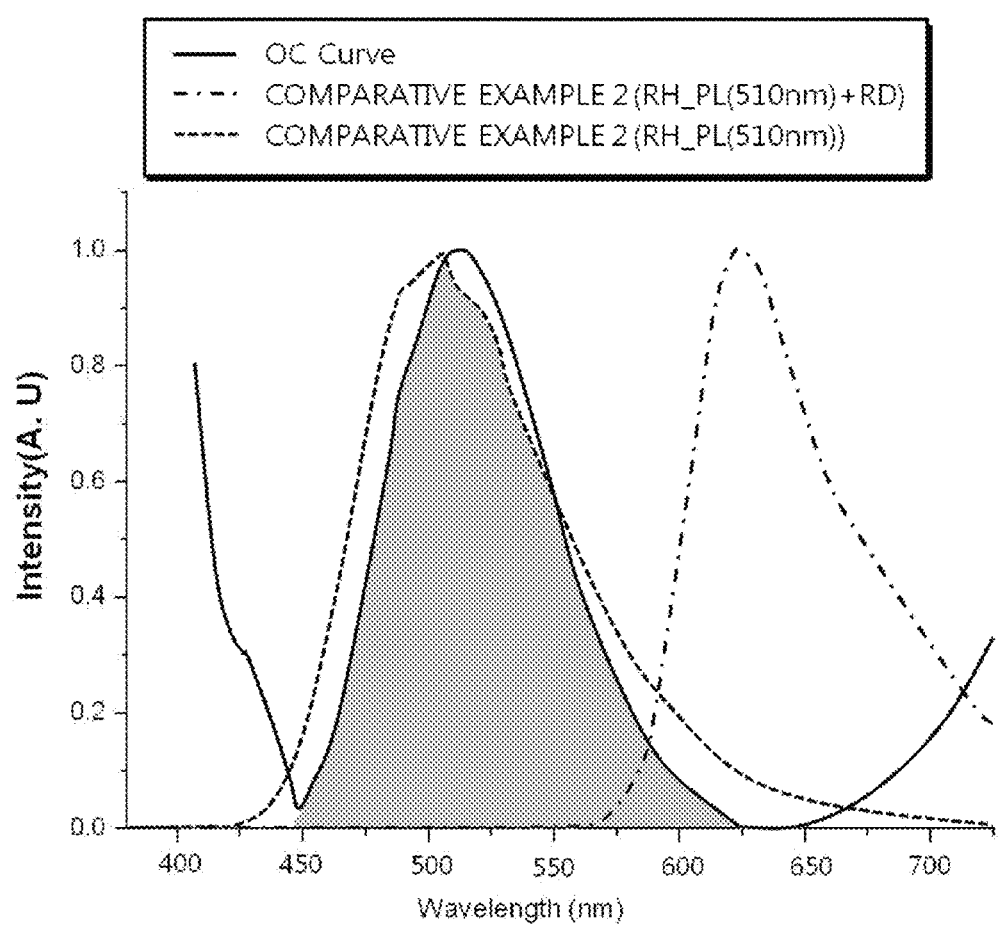
Figure 3C:
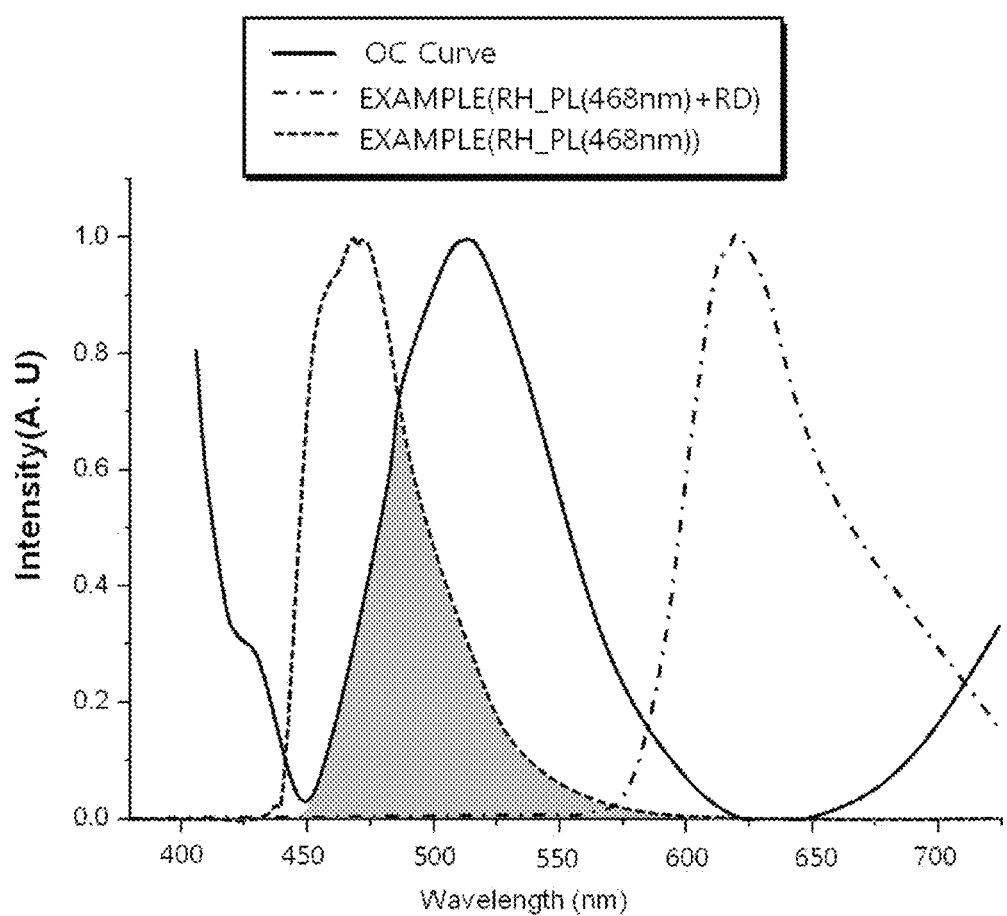

FIGS. 3A to 3C are graphs showing luminescence spectrums according to a maximum photoluminescence peak of a red host of a red EML of each of the organic light emitting display devices according to comparative examples and example when a second electrode of each thereof is formed as a transparent electrode and has a thickness of 500 Å. In this regard, formation of the second electrode to a thickness of 500 Å is because an out-coupling curve is present around 525 nm, which is the same wavelength as that at a viewing angle of 60 degrees when the second electrode is a semi-transparent electrode and thus the host of the corresponding color emits light around 525 nm.

In Comparative Example 1 illustrated in FIG. 3A, a red host included in a red EML is formed of a carbazole derivative having a maximum photoluminescence peak of 490 nm and, in Comparative Example 2 illustrated in FIG. 3B, a red host included in a red EML is formed of a carbazole derivative having a maximum photoluminescence peak of 510 nm. In this case, an overlapping area between the photoluminescence peak of the red host and a maximum luminescence peak (OC curve) of a red light emitting cell is wide. As the overlapping area increases, amplification between the two peaks increases and thus luminescent strength increases, leading to the greatest change in color according to viewing angle.

By contrast, in example illustrated in FIG. 3C, when a red host is formed of a Be complex derivative having a maximum photoluminescence peak of 468 nm, an overlapping area between the photoluminescence peak of the red host and a maximum luminescence peak (OC curve) of a red light emitting cell is small. As the overlapping area decreases, amplification between the two peaks decreases, which leads to the smallest change in color according to viewing angle.

Figure 4:
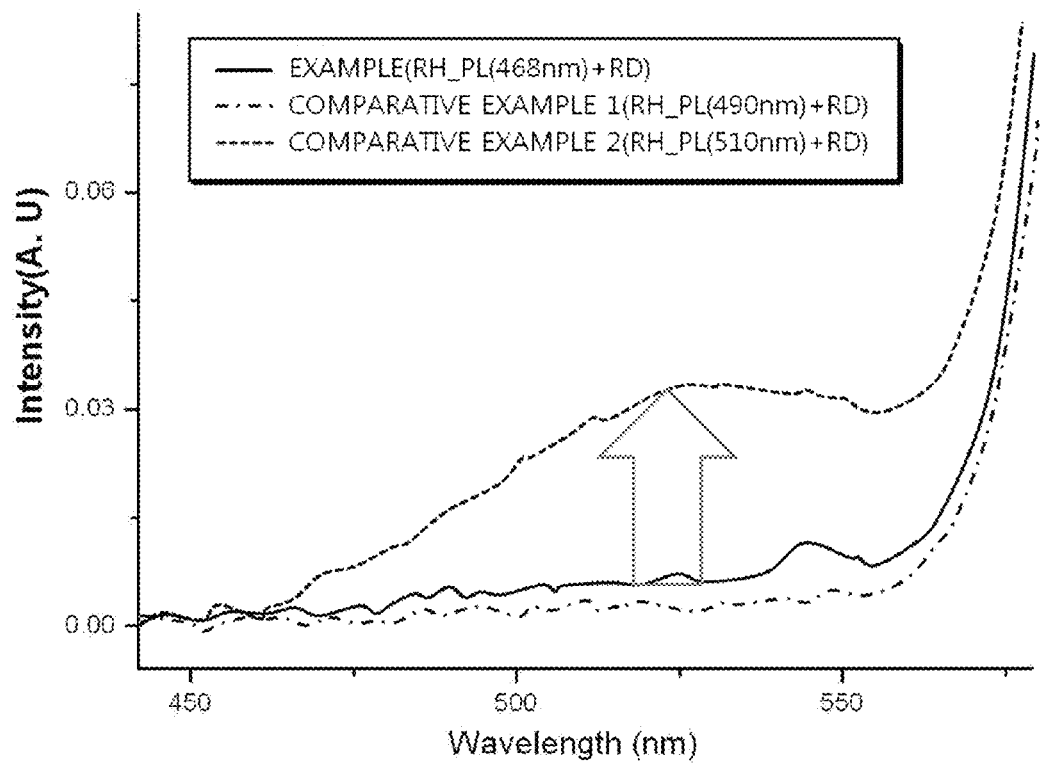
FIG. 4 is an enlarged view of a region of a wavelength of 450 to 575 nm in luminescence spectrums of each of the organic light emitting display devices of comparative examples and example illustrated in FIGS. 3A to 3C.

In addition, in Comparative Example 1 in which the red EML includes the red host formed of a carbazole derivative having a maximum photoluminescence peak of 510 nm and a red dopant, a shoulder peak as illustrated in FIG. 4 is present at a wavelength of 500 to 550 nm and thus color purity is reduced. By contrast, in example in which an EML includes a red host formed of Be complex series having a maximum photoluminescence peak of 468 nm and a red dopant, a shoulder peak is not present at a wavelength of 500 to 550 nm and thus color purity reliability is enhanced.

Figure 5A:
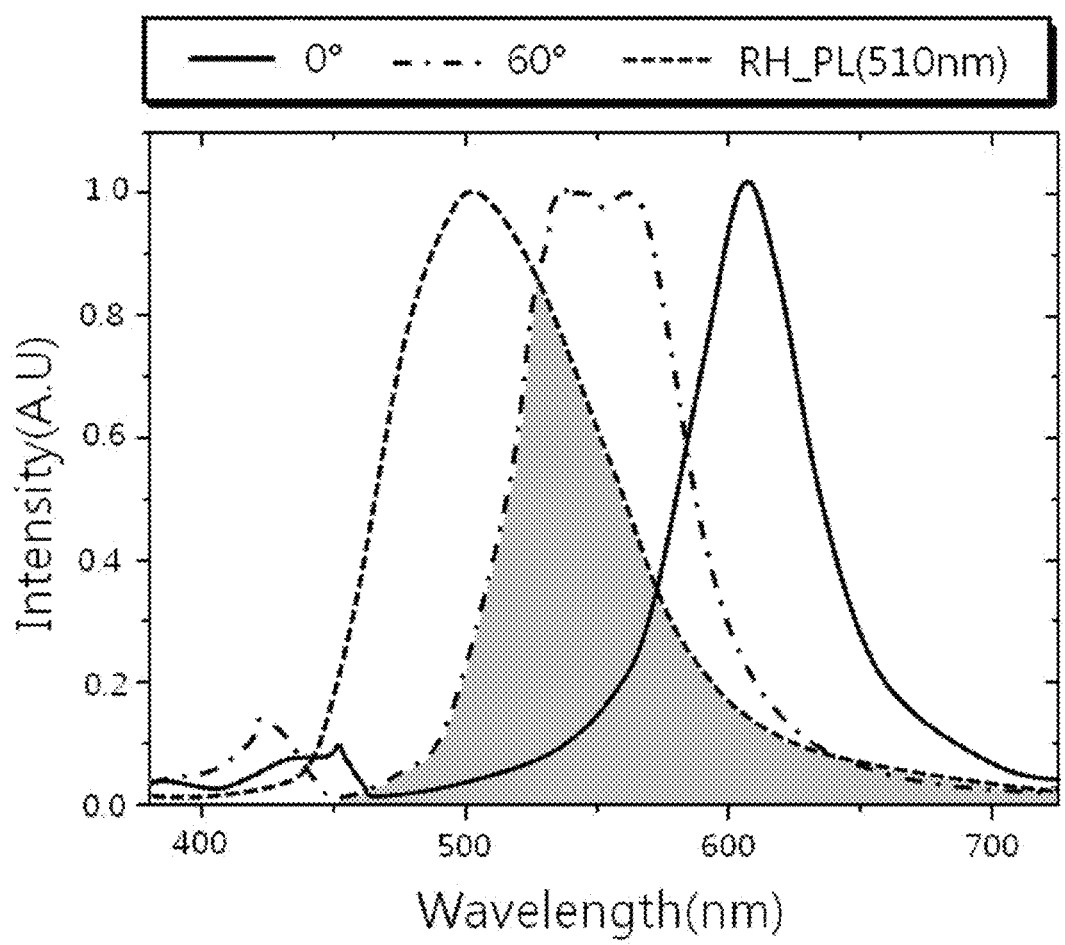
FIGS. 5A and 5B are images and graphs showing luminescence spectrums according to viewing angle of organic light emitting display devices according to Comparative Example and Example when a second electrode of each organic light emitting display device is a semi-transparent electrode.
Figure 5B:
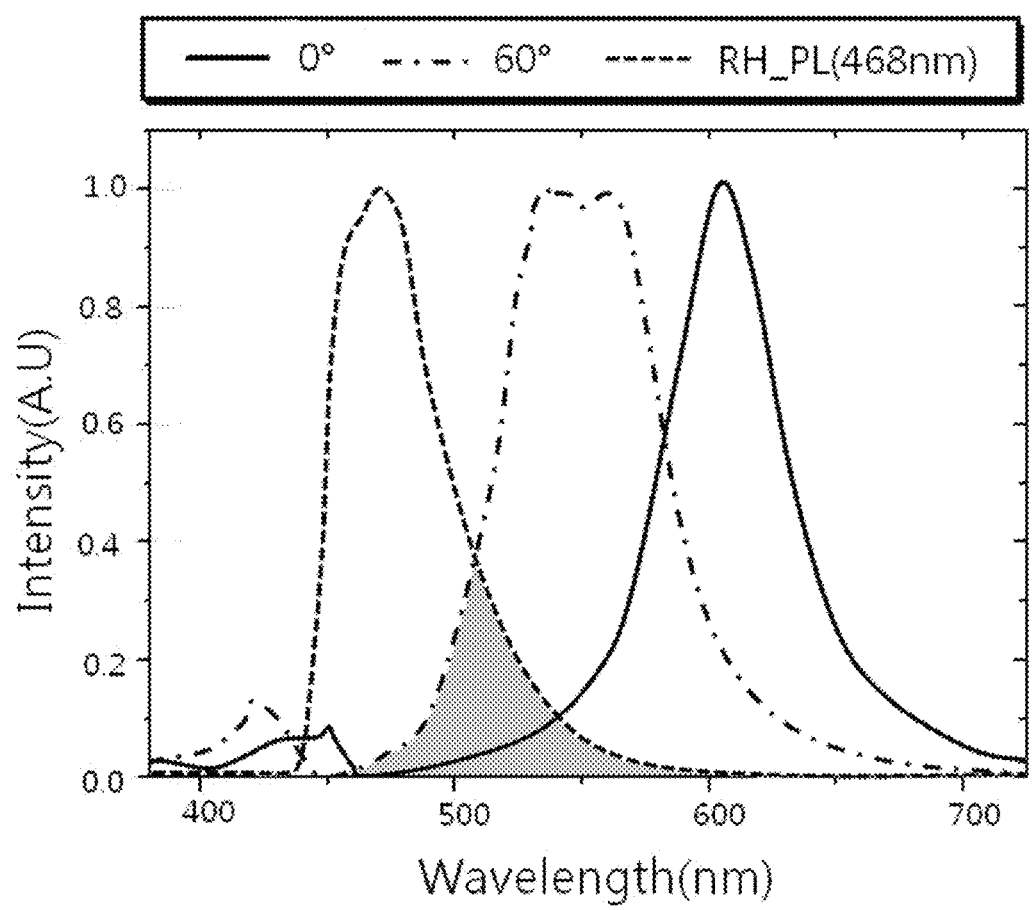

FIGS. 5A and 5B are images and graphs showing luminescence spectrums according to viewing angles of organic light emitting display devices according to Comparative Example and Example when a second electrode of each organic light emitting display device is a semi-transparent electrode.

In Comparative Example illustrated in FIG. 5A, when a red host included in a red EML is formed of a carbazole derivative having a maximum photoluminescence peak of 510 nm, a maximum electroluminescent peak (REDELλmax) of a red EML is 620 nm and thus a difference between the maximum electroluminescent peak (REDELλmax) of a red EML and a maximum photoluminescence peak (RHPLλmax) of the red host included in the red EML is 110 nm. In this case, an overlapping area between the electroluminescent peak of the red EML and the photoluminescence peak of the red host at a viewing angle of 0 degrees is relatively wide, and an overlapping area between the electroluminescent peak of the red EML and the photoluminescence peak of the red host at a viewing angle of 60 degrees is relatively wide. As the overlapping area between the electroluminescent peak of the red EML and the photoluminescence peak of the red host increases, amplification of the electroluminescent peak of the red EML and the photoluminescence peak of the red host increases and thus changes in color occur. Accordingly, there is a difference between colors at viewing angles of 0° and 60°.

By contrast, in Example illustrated in FIG. 5B, when a red host included in a red EML is formed of Be complex series having a maximum photoluminescence peak of 468 nm, a maximum electroluminescent peak (REDELλmax) of the red EML 110 is 620 nm and thus a difference between the maximum electroluminescent peak (REDELλmax) of the red EML 110 and a maximum photoluminescence peak (RHPLλmax) of the red host included in the red EML 110 is 152 nm, which is greater than 120 nm. In this case, an overlapping area between the electroluminescent peak of the red EML 110 and the photoluminescence peak of the red host at a viewing angle of 0° is smaller than that in Comparative Example, and an overlapping area between the electroluminescent peak of the red EML 110 and the photoluminescence peak of the red host at a viewing angle of 60° is smaller than that in Comparative Example. As the overlapping area between the electroluminescent peak of the red EML 110 and the photoluminescence peak of the red host decreases, amplification of the electroluminescent peak of the red EML 110 and the photoluminescence peak of the red host is relatively small and thus changes in color hardly occur. Accordingly, a difference between colors at viewing angles of 0° and 60° is small and thus color purity according to viewing angle is kept maintained and color purity reliability is enhanced.

As is apparent from the foregoing description, in an organic light emitting display device according to the present invention, a difference between a maximum electroluminescent peak (REDEL$\lambda$max) of a red EML and a maximum photoluminescence peak (RHPL$\lambda$max) of a red host included in the red EML is 120 nm or greater, a difference between a maximum electroluminescent peak (GREENEL$\lambda$max) of a green EML and a maximum photoluminescence peak (GHPL$\lambda$max) of a green host included in the green EML is 20 nm or greater, and a difference between a maximum electroluminescent peak (BLUEEL$\lambda$max) of a blue EML and a maximum photoluminescence peak (BHPL$\lambda$max) of a blue host included in the blue EML is 20 nm or greater. Accordingly, the organic light emitting display device may undergo no reduction in color purity according to viewing angle and suppress host emission, whereby color reliability according to viewing angle may be enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a first electrode formed on a substrate and being a reflective electrode;
a second electrode facing the first electrode and being a semi-transparent electrode; and
red, green and blue emission layers formed between the first and second electrodes,
wherein a maximum electroluminescent peak of each of the red, green and blue emission layers and a maximum photoluminescence peak of a host included in each emission layer satisfy Equations 1 to 3 below:

$$RED_{EL\lambda max} - RH_{PL\lambda max} \geq 120 \text{ nm} \quad \text{<Equation 1>}$$

wherein $RED_{EL\lambda max}$ is a maximum electroluminescent peak of the red emission layer, and $RH_{PL\lambda max}$ is a maximum photoluminescence peak of a red host included in the red emission layer, $$Green_{EL\lambda max} - GH_{PL\lambda max} \geq 20 \text{ nm} \quad \text{<Equation 2>}$$

wherein $GREEN_{EL\lambda max}$ is a maximum electroluminescent peak of the green emission layer, and $GH_{PL\lambda max}$ is a maximum photoluminescence peak of a green host included in the green emission layer, and $$BLUE_{EL\lambda max} - BH_{PL\lambda max} \geq 20 \text{ nm} \quad \text{<Equation 3>}$$

wherein $BLUE_{EL\lambda max}$ is a maximum electroluminescent peak of the blue emission layer, and $BH_{PL\lambda max}$ is a maximum photoluminescence peak of a blue host included in the blue emission layer,
wherein the red host is formed of Be complexes such as BeBq$_2$ represented by Formula 1 below:

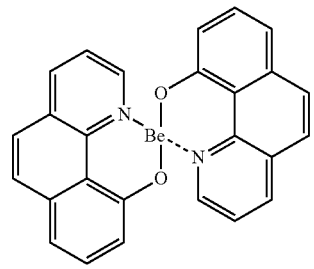

<Formula 1> wherein the blue host is formed of a material represented by Formula 4 below:

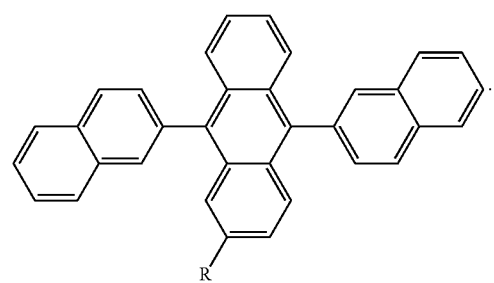

<Formula 4>

DNA/MADN/TBADN

2. The organic light emitting display device according to claim 1, wherein the maximum photoluminescence peak of a red host is between 450 and 485 nm, the maximum photoluminescence peak of a green host is between 450 and 530 nm, and the maximum photoluminescence peak of a blue host is between 400 and 435 nm.

3. The organic light emitting display device according to claim 2, further comprising a front sealing layer formed on the second electrode, the front sealing layer comprising organic layers and inorganic layers alternately formed several times.

4. The organic light emitting display device according to claim 1, wherein each of the layers of the second electrode being formed of a metal, an inorganic material, a mixture of metals, a mixture of a metal and an inorganic material, or a mixture thereof, and wherein the metal is selected from the group consisting of Mg, Yb, Li, and Ca, and the inorganic material is LiO$_2$, CaO, or MgF$_2$.

5. An organic light emitting display device comprising:
a first electrode formed on a substrate and being a reflective electrode;
a second electrode facing the first electrode and being a semi-transparent electrode; and
red, green and blue emission layers formed between the first and second electrodes,
wherein a maximum electroluminescent peak of each of the red, green and blue emission layers and a maximum photoluminescence peak of a host included in each emission layer satisfy Equations 1 to 3 below:

$$RED_{EL\lambda max} - RHPL\lambda max \geq 120 \text{ nm} \quad \text{<Equation 1>}$$

wherein REDEL$\lambda$max is a maximum electroluminescent peak of the red emission layer, and RHPL$\lambda$max is a maximum photoluminescence peak of a red host included in the red emission layer, $$GREENEL\lambda max - GHPL\lambda max \geq 20 \text{ nm} \quad \text{<Equation 2>}$$

wherein GREENEL$\lambda$max is a maximum electroluminescent peak of the green emission layer, and GHPL$\lambda$max is a maximum photoluminescence peak of a green host included in the green emission layer, and $$BLUEEL\lambda max - BHPL\lambda max \geq 20 \text{ nm} \qquad <\text{Equation 3}>$$

wherein BLUEEL$\lambda$max is a maximum electroluminescent peak of the blue emission layer, and BHPL$\lambda$max is a maximum photoluminescence peak of a blue host included in the blue emission layer, wherein the second electrode has a single layer structure or a multilayer structure and has a total thickness of 100 to 400 Å, each of the layers of the second electrode being formed of a mixture of a metal and an inorganic material, wherein a mix ratio of the metal to the inorganic material is between 10:1 and 1:10, and wherein the metal is selected from the group consisting of Mg, Yb, Li, and Ca, and the inorganic material is LiO2, CaO, or MgF2.

6. The organic light emitting display device according to claim 5, wherein the second electrode has a transmittance of 30 to 60% at a wavelength of 430 nm, a transmittance of 20 to 50% at a wavelength of 550 nm, and a transmittance of 15 to 40% at a wavelength of 650 nm, and the second electrode has a sheet resistance of 1Ω/□ to 15Ω/□ and a work function of 3.7 to 4.7 eV.

* * * * *